(12) United States Patent
Haentzschel et al.

(10) Patent No.: US 9,727,119 B2
(45) Date of Patent: Aug. 8, 2017

(54) CONTROLLING POWER STATES OF A DEVICE

(71) Applicant: ATMEL Corporation, San Jose, CA (US)

(72) Inventors: Dirk Haentzschel, Porschendorf (DE); Falk Hofmann, Dresden (DE)

(73) Assignee: Atmel Corporation, San Jose, CA (US)

( * ) Notice: Subject to any disclaimer, the term of this patent is extended or adjusted under 35 U.S.C. 154(b) by 140 days.

(21) Appl. No.: 14/530,518

(22) Filed: Oct. 31, 2014

(65) Prior Publication Data

US 2016/0124488 A1    May 5, 2016

(51) Int. Cl.
| | |
|---|---|
| G06F 1/32 | (2006.01) |
| G06F 13/42 | (2006.01) |
| G11C 5/14 | (2006.01) |
| G06F 1/26 | (2006.01) |

(52) U.S. Cl.
CPC .......... *G06F 1/3253* (2013.01); *G06F 1/3287* (2013.01); *G06F 13/4282* (2013.01); *G06F 1/26* (2013.01); *G06F 1/3203* (2013.01); *G06F 1/3206* (2013.01); *G06F 1/3275* (2013.01); *G06F 1/3296* (2013.01); *G11C 5/148* (2013.01); *G11C 2216/30* (2013.01); *Y02B 60/1228* (2013.01); *Y02B 60/1235* (2013.01)

(58) Field of Classification Search
CPC ........ G06F 1/26; G06F 1/3203; G06F 1/3206; G06F 1/3287; G06F 1/3275; G06F 1/3296; G06F 13/4282; G06F 1/3253; G11C 2216/30; G11C 5/148
See application file for complete search history.

(56) References Cited

U.S. PATENT DOCUMENTS

| | | | | |
|---|---|---|---|---|
| 2002/0104031 A1* | 8/2002 | Tomlinson | ................ | G06F 1/28 713/320 |
| 2004/0078500 A1* | 4/2004 | Pezzini | ................. | G06F 13/385 710/36 |
| 2006/0071643 A1* | 4/2006 | Carrier | .............. | H01M 10/4257 320/132 |
| 2009/0089599 A1* | 4/2009 | Westwick | ............. | G06F 1/3203 713/323 |
| 2014/0032956 A1* | 1/2014 | De Caro | ............... | G06F 1/3275 713/324 |

* cited by examiner

*Primary Examiner* — Jaweed A Abbaszadeh
*Assistant Examiner* — Terrell Johnson
(74) *Attorney, Agent, or Firm* — Fish & Richardson P.C.

(57) ABSTRACT

Methods, systems, and apparatus, including computer programs encoded on computer storage media, for controlling power states of a device. In one aspect, a circuit is configured to perform operations comprising: receiving, on a data pin of an SPI control interface, a command to enter a reduced power mode; determining that a select signal on a select pin of the SPI control interface has been released; in response to receiving the command to enter the reduced power mode and determining that the select signal has been released, causing the circuit to enter the reduced power mode; determining that the select signal on the select pin of the SPI control interface has been asserted; and in response to determining that the select signal on the select pin has been asserted, causing the circuit to exit the reduced power mode.

20 Claims, 5 Drawing Sheets

CONTROLLING POWER STATES OF A DEVICE

TECHNICAL FIELD

This disclosure relates generally to controlling power states of a device.

BACKGROUND

Many electronic devices can enter a reduced power mode, e.g., a sleep mode or an off mode, when appropriate to save power. A controller can send a command to a device to enter a reduced power mode using an interface, e.g., a serial peripheral interface (SPI) bus. However, when the device is in the reduced power mode, the device may not be able to use the SPI bus to receive a command to exit the reduced power mode. Some devices have an additional pin to receive a signal from a controller indicating a command to exit the reduced power mode. For example, a device can have an interface with five pins: four for the SPI bus (clock, data in, data out, and select) and one for controlling the power state.

SUMMARY

This specification describes controlling power states of a device. In one aspect, a circuit is configured to perform operations comprising: receiving, on a data pin of an SPI control interface, a command to enter a reduced power mode; determining that a select signal on a select pin of the SPI control interface has been released; in response to receiving the command to enter the reduced power mode and determining that the select signal has been released, causing the circuit to enter the reduced power mode; determining that the select signal on the select pin of the SPI control interface has been asserted; and in response to determining that the select signal on the select pin has been asserted, causing the circuit to exit the reduced power mode.

The details of one or more disclosed implementations are set forth in the accompanying drawings and the description below. Other features, aspects, and advantages will become apparent from the description, the drawings and the claims.

DETAILED DESCRIPTION

System Overview

Figure 1A:
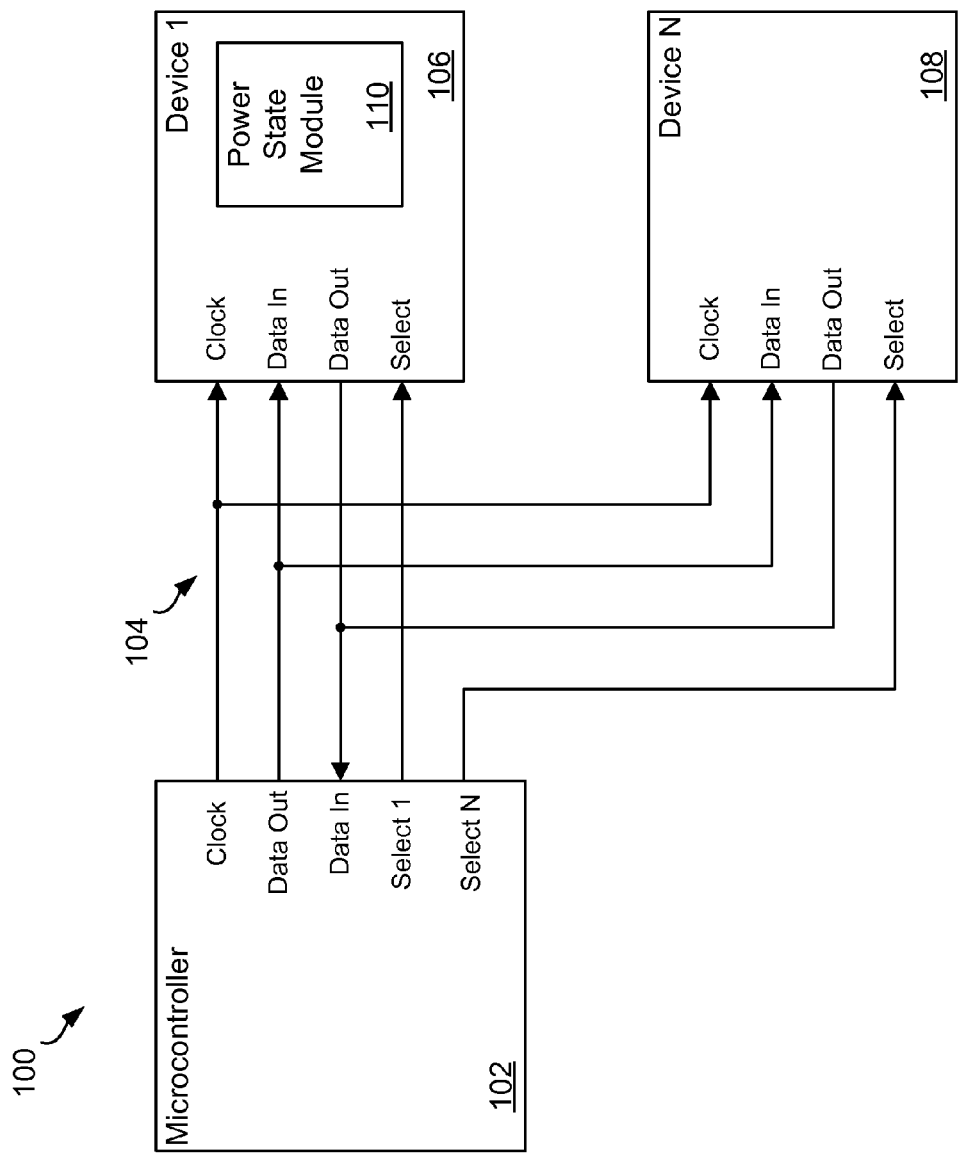
FIG. 1A is a block diagram of an example system including a microcontroller communicating over an SPI bus with several devices.

FIG. 1A is a block diagram of an example system 100 including a microcontroller 102 communicating over an SPI bus 104 with several devices 106, 108. Each device includes a control interface with pins for a clock signal, a data in signal, a data out signal, and a select signal.

Figure 1B:
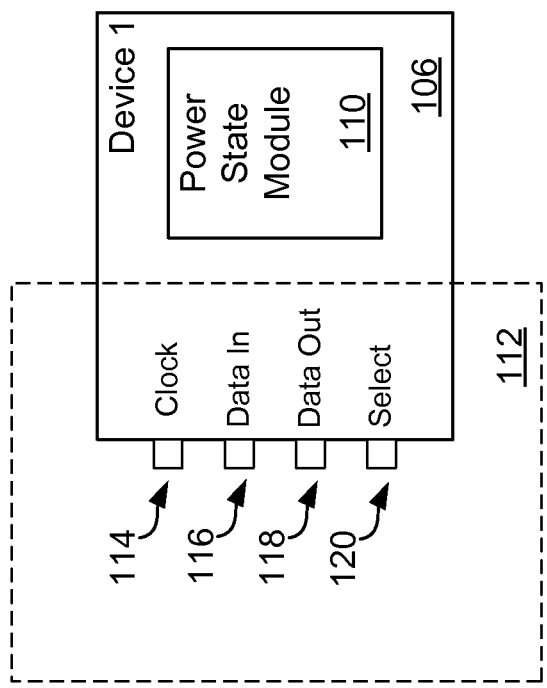
FIG. 1B is a block diagram illustrating an example SPI control interface for a first device.

FIG. 1B is a block diagram illustrating an example SPI control interface 112 for a first device 106. The control interface 112 includes four pins: a first pin 114 for receiving a clock signal, a second pin 116 for receiving incoming data, a third pin 118 for transmitting outgoing data, and a fourth pin 120 for selecting the control interface 112 from other SPI control interfaces.

Referring back to FIG. 1A, The SPI bus 104 is a synchronous serial data link that typically operates in full duplex mode. It can be used, e.g., for short distance, single master communication, e.g., in embedded systems or in a system-on-a-chip.

The microcontroller 102 is configured to act as a master on the SPI bus 104, and the devices 106, 108 are configured to act as slaves. The microcontroller 102 selects one of the devices 106, 108 using select signals that are individually supplied to each of the devices 106, 108. The microcontroller 102 selects one device at a time, and each device that has not been selected by its select signal disregards the input clock and data signals. The microcontroller 102 supplies a clock signal and initiates data frames.

To initiate a transmission, the microcontroller 102 configures the clock and then configures the appropriate select line by modulating the select signal for the selected device, i.e., causing the select signal to go to logic 0 voltage. A full duplex data transmission can occur during each clock cycle of the clock signal. The microcontroller 102 sends a bit on its data out pin, and the slave reads the data signal on its data in pin. The slave then sends a bit on its data out pin, and the microcontroller 102 reads the data signal on its data in pin. When the transmission is complete, the microcontroller 102 ceases the clock signal and then deselects the slave by modulating the select signal, i.e., causing the select signal to go to logic 1 voltage.

At least one device 106 is configured to operate in two or more power modes. The power modes can include, e.g., a normal operation mode and a sleep mode. In the sleep mode, the device 106 uses less power than in the normal operation mode. Some of the functionality of the device 106 may be disabled in the sleep mode when that functionality is not needed, which can be useful, e.g., to save power. A power state module 110 is configured to control the power modes of the device 106.

The functionality of the select signal can be extended to control the power state module 110 of the device 106. For example, the microcontroller 102 can first send a SLEEP command to the device 106 on the data line. The microcontroller 102 can then release the select signal, causing the power state module 110 to put the device 106 into a sleep mode.

To wake up the device 106, the microcontroller 102 can then assert the select signal. After the device 106 exits the sleep mode, the functionality of the select signal returns to conventional SPI operation, e.g., for selecting the device 106 for a transmission on the SPI bus 104. This is useful, for example, so that the device 106 does not need an extra pin for an extra signal to wake up the device 106. The lack of an extra pin can reduce the size and/or cost of the device 106.

Although FIG. 1 illustrates a microcontroller 102 on an SPI bus 104, any appropriate device and/or bus can be used. For example, the bus 104 can be an $I^2C$ bus. In that case, the devices each include an $I^2C$ control interface including a clock pin and a data pin, and the devices 106, 108 can use the data pin to control the power states of the devices 106, 108.

The microcontroller 102, or another appropriate system of one or more computers, can be configured to perform particular actions by virtue of having software, firmware, hardware, or a combination of them installed on the microcontroller 102 that in operation causes or cause the microcontroller 102 to perform the actions. One or more computer programs can be configured to perform particular actions by virtue of including instructions that, when executed by data processing apparatus, cause the apparatus to perform the actions.

The device 106 can be configured to perform particular actions by virtue of having software, firmware, hardware, or a combination of them installed on the device 106 that in operation causes or cause the device 106 to perform the actions. The device 106 can be, e.g., a transceiver, an analog-to-digital converter (ADC), or any other appropriate type of electronic device.

Example Power State Module

Figure 2:
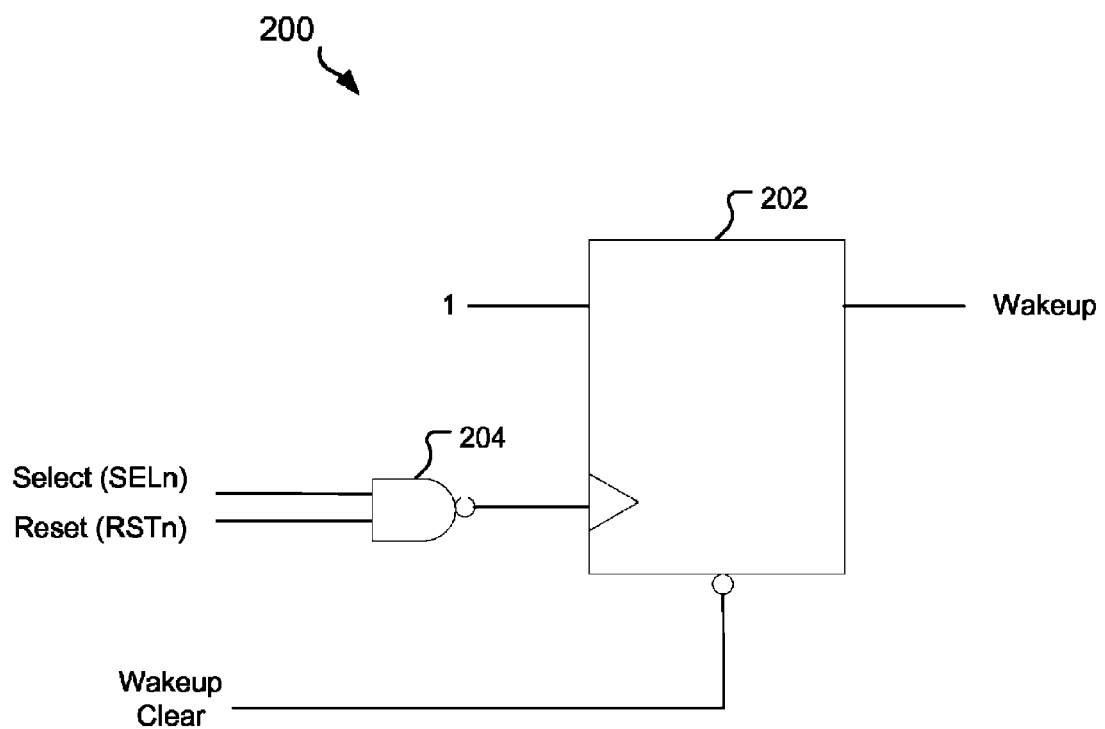
FIG. 2 is a circuit diagram of an example circuit that can be used in the power state module of FIG. 1.

FIG. 2 is a circuit diagram of an example circuit 200 that can be used in the power state module 110 of FIG. 1. The circuit 200 includes a D flip-flop 202 and a NAND gate 204.

The data input of the flip-flop 202 is tied to a logic 1 level, and the reset input is tied to a Wakeup Clear signal. The clock input of the flip-flop 202 is tied to the output of the NAND gate 204. The NAND gate 204 receives as inputs a select signal and a reset signal. The inputs signals are active low signals (SELn, RSTn). The output of the flip-flop 202 supplies a Wakeup signal.

In operation, the Wakeup signal, when asserted by the circuit 200, causes the device 106 to exit the sleep mode. The Wakeup Clear signal resets the flip-flop 202 when the device 106 enters a sleep mode. When the select signal is asserted, the flip-flop 202 toggles and the Wakeup signal rises.

The reset signal can also be used to cause the device 106 to exit the sleep mode. When the reset signal is triggered, the flip-flop 202 toggles and the Wakeup signal rises. The reset signal can be asserted by any appropriate device, e.g., the microcontroller 102 or by a device external to the system. The operation of the circuit 200 is described further below with reference to FIG. 3.

Example Timing Diagram

Figure 3:
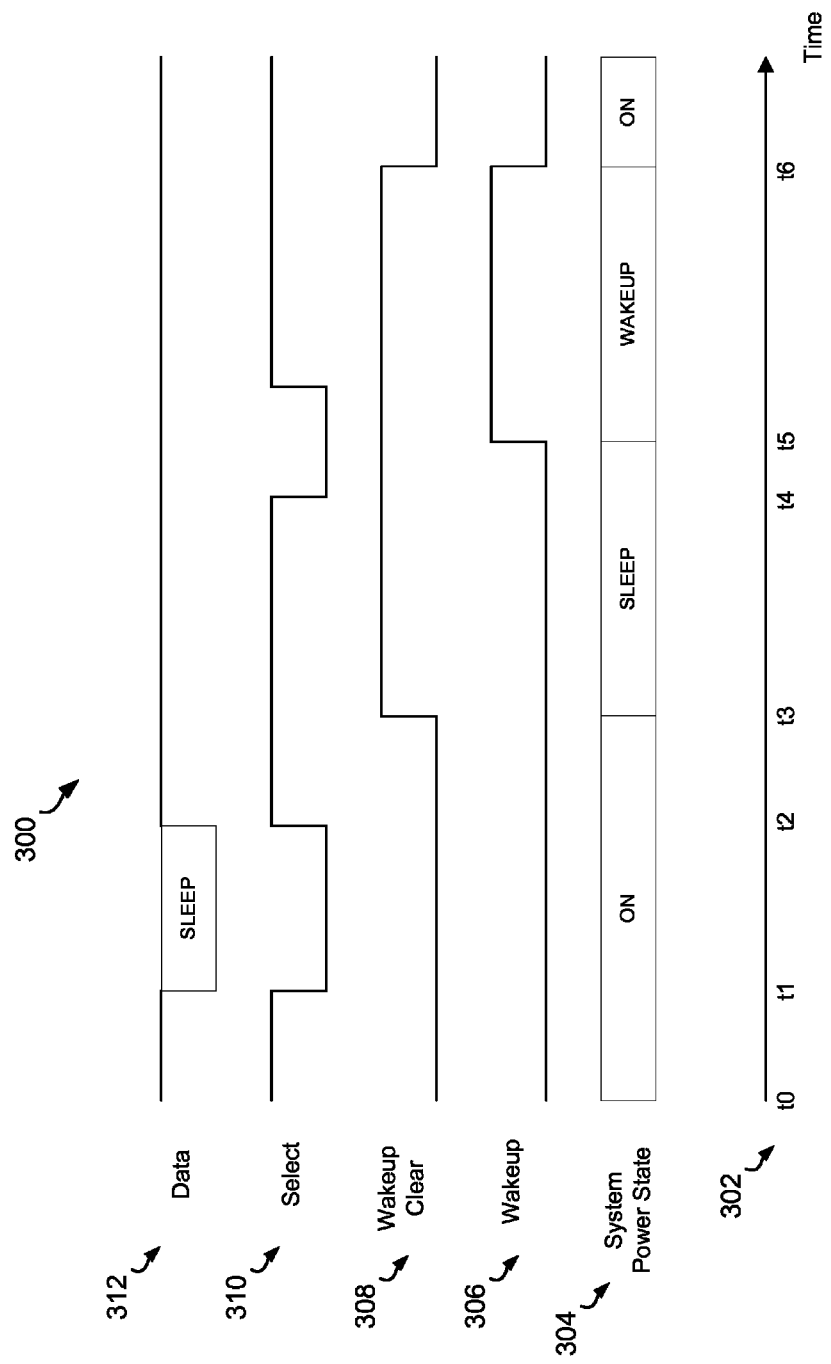
FIG. 3 is an example timing diagram illustrating the operation of the example circuit of FIG. 2 when used in the device of FIG. 1.

FIG. 3 is an example timing diagram 300 illustrating the operation of the example circuit 200 of FIG. 2 when used in the device 106 of FIG. 1. The timing diagram 300 is situated over a timeline 302.

A first row 304 of the timing diagram 300 illustrates the system power state. A second row 306 of the timing diagram 300 illustrates the Wakeup signal illustrated in FIG. 2. A third row 308 of the timing diagram 300 illustrates the Wakeup Clear signal illustrated in FIG. 2. A fourth row 310 of the timing diagram 300 illustrates the Select signal illustrated in FIGS. 1 and 2. A fifth row 312 of the timing diagram 300 illustrates the Data In signal illustrated in FIG. 1.

A time t0, the system power state is ON. At time t1, the microcontroller 102 asserts the select line for the device 106, thus selecting the device 106 for a transmission. The microcontroller 102 transmits a SLEEP command on the data line. A time t2, the transmission completes, and the microcontroller 102 releases the select line.

At time t3, the Wakeup Clear signal rises to a logic 1 level as the system power state transitions to the SLEEP mode. At time t4, the microcontroller asserts the select line for the device 106. The Wakeup signal rises at time t5 and the device 106 starts the WAKEUP procedure to exit the SLEEP mode. At time t6, the Wakeup Clear and Wakeup signals fall to a logic 0 level, and the system transitions to a system power state of ON.

Example Flow Diagram

Figure 4:
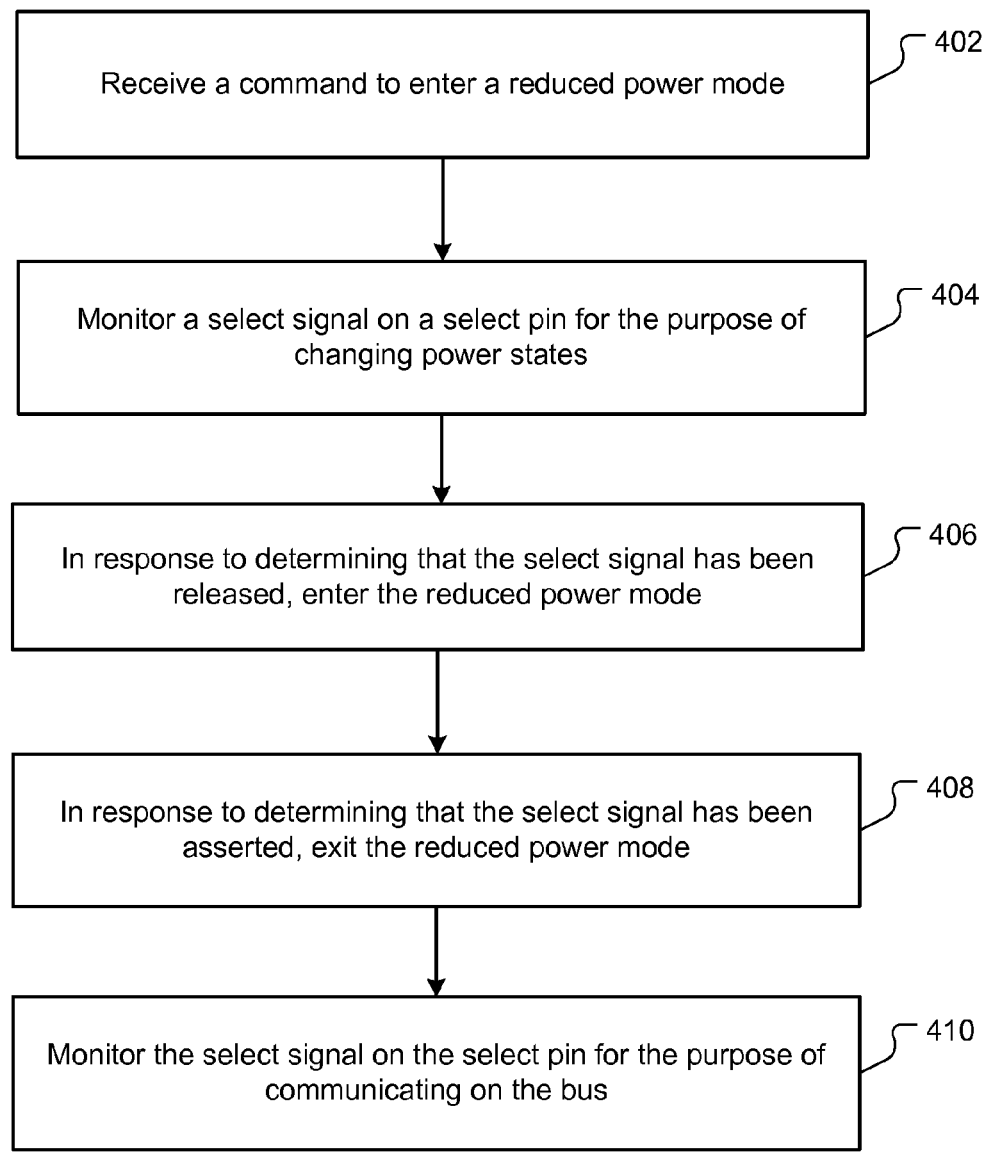
FIG. 4 is flow diagram of an example method performed by a device.

FIG. 4 is flow diagram of an example method 400 performed by a device, e.g., the device 106 of FIG. 1.

The device receives, on a control interface, a command to enter a reduced power mode (402). The control interface includes at least a data pin and a select pin. For example, the control interface can include four pins for communicating on an SPI bus, e.g., as described above with reference to FIG. 1.

The device monitors a select signal on a select pin for the purposes of changing power states (404). In response to determining that the select signal has been released, the device enters the reduced power mode (406). The device stays in the reduced power mode until the select signal, or in some implementations an optional reset signal, commands the device to exit the reduced power mode.

After entering the reduced power mode and in response to determining that the select signal on the select pin has been asserted, the device exits the reduced power mode (408). The device monitors the select signal on the select pin for the purpose of communicating on the bus (410) and not for the purpose of changing power states.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, microcontrollers or general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices, e.g., non-transitory computer readable media, for storing instructions.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. For example, the subject matter is described in context of scientific papers. The subject matter can apply to other indexed work that adds depth aspect to a search. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing can be advantageous.

What is claimed is:

1. An electronic device comprising:
   a serial peripheral interface (SPI) control interface comprising at least:
      a data pin for communicating data; and
      a select pin for selecting the SPI control interface from a plurality of SPI interfaces;
   a first circuit configured to perform operations comprising:
      receiving, from the data pin of the SPI control interface, a command to enter a first power mode;
      determining that a select signal on the select pin of the SPI control interface has been released;
      in response to receiving the command to enter the first power mode and determining that the select signal has been released, entering the first power mode from a second power mode, the first circuit using less power in the first power mode than in the second power mode;
      determining that the select signal on the select pin of the SPI control interface has been asserted; and
      in response to determining that the select signal on the select pin has been asserted, exiting the first power mode; and
   a second circuit coupled to the select pin and configured to:
      after the select signal has been released, when the first circuit enters the first power mode, reset by a rise of a wakeup clear signal;
      in response to the assertion of the select pin and the rise of the wakeup clear signal, cause a rise of an output wakeup signal to start a wakeup procedure to bring the first circuit out of the first power mode, and
      cause a fall of the wakeup signal by a fall of the wakeup clear signal to bring the first circuit into the second power mode,
      wherein, after the assertion of the select pin, the select signal is released after the rise of the wakeup signal and before the fall of the wakeup signal.

2. The electronic device of claim 1, the operations comprising: before receiving the command to enter the first power mode, using the select signal to enable the control interface and to select the electronic device from a plurality of electronic devices.

3. The electronic device of claim 2, the operations comprising: after exiting the first power mode, using the select signal to enable the control interface and to select the electronic device from the plurality of electronic devices.

4. The electronic device of claim 1, wherein the SPI control interface includes a clock pin, a data input pin, a data output pin, and the select pin.

5. The electronic device of claim 1, wherein receiving the command to enter a first power mode comprises receiving the command from a microcontroller, and wherein the microcontroller comprises a processor and a memory storing instructions that, when executed by the processor, cause the microcontroller to release and assert the select signal to control a power mode of the electronic device.

6. The electronic device of claim 1, wherein the second circuit comprises a flip-flop configured to, in response to the assertion of the select signal, toggle to cause the wakeup signal to rise to cause the first circuit to exit the first power mode and start the wakeup procedure.

7. The electronic device of claim 1, wherein the second circuit comprises a flip-flop including a clock input tied to an output of a logic gate that receives as inputs the select signal on the select pin and a reset signal, and
   wherein the flip-flop is configured to:
      in response to the assertion of the select signal, toggle to cause the wakeup signal to rise; and
      in response to a trigger of the reset signal, toggle to cause the wakeup signal to rise.

8. A microcontroller comprising:
   a processor; and
   a memory storing instructions that, when executed by the processor, cause the processor to perform operations comprising:
      sending, to a data pin of a serial peripheral interface (SPI) control interface of an electronic device, a command to enter a first power mode;
      after sending the command to enter the first power mode, releasing a select signal on a select pin of the SPI control interface, causing a first circuit of the electronic device to enter the first power mode from a second power mode, the first circuit of the electronic device using less power in the first power mode than in the second power mode;
      after releasing the select signal on the select pin, when the first circuit of the electronic device enters the first power mode, resetting a second circuit of the electronic device by causing a rise of a wakeup clear signal, the second circuit being coupled to the select pin and configured to receive the select signal on the select pin;
      asserting the select signal on the select pin, causing a rise of a wakeup signal from the second circuit to start a wakeup procedure for the first circuit to exit the first power mode; and
      causing a fall of the wakeup clear signal to cause a fall of the wakeup signal to bring the electronic device into the second power mode,
      wherein after the assertion of the select signal, the select signal is released after the rise of the wakeup signal and before the fall of the wakeup signal.

9. The microcontroller of claim 8, the operations comprising: before sending the command to enter the first power mode, using the select signal to enable the control interface and to select the electronic device from a plurality of electronic devices.

10. The microcontroller of claim 9, the operations comprising: after asserting the select signal on the select pin, using the select signal to enable the control interface and to select the electronic device from the plurality of electronic devices.

11. The microcontroller of claim 8, wherein the control interface is a serial peripheral interface (SPI) control interface that includes a clock pin, a data input pin, a data output pin, and the select pin.

12. The microcontroller of claim 8, wherein the operations comprise acting as a master module on a bus coupled to the control interface and selecting the electronic device for communications on the bus using the select signal.

13. The microcontroller of claim 8, wherein the circuit comprises a flip-flop including a clock input tied to an output of a logic gate that receives as inputs the select signal on the select pin and a reset signal from the processor, and
wherein the operations comprise:
asserting the select signal to toggle the flip-flop to cause the wakeup signal to rise; and
triggering the reset signal to toggle the flip-flop to cause the wakeup signal to rise, causing the electronic device to exit the first power mode.

14. A method performed by an electronic device, the method comprising:
receiving, on a data pin of a serial peripheral interface (SPI) control interface, a command to enter a first power mode;
determining that a select signal on the select pin of the SPI control interface has been released;
in response to receiving the command to enter the first power mode and determining that the select signal has been released, causing a first circuit of the electronic device to enter the first power mode from a second power mode, the first circuit using less power in the first power mode than in the second power mode;
after the select signal has been released, when the first circuit enters the first power mode, resetting a second circuit of the electronic device by a rise of a wakeup clear signal;
determining that the select signal on the select pin of the SPI control interface has been asserted, the second circuit being coupled to the select pin and configured to receive the select signal on the select pin;
in response to an assertion of the select signal and the rise of the wakeup clear signal, causing a wakeup signal output by the second circuit to rise to start a wakeup procedure for the first circuit to exit the first power mode; and
causing a fall of the wakeup signal by a fall of the wakeup clear signal to bring the first circuit into the second power mode,
wherein, after the assertion of the select signal, the select signal is released after the rise of the wakeup signal and before the fall of the wakeup signal.

15. The method of claim 14, comprising: before receiving the command to enter the first power mode, using the select signal to enable the control interface and to select the electronic device from a plurality of electronic devices.

16. The method of claim 15, comprising: after exiting the first power mode, using the select signal to enable the control interface and to select the electronic device from the plurality of electronic devices.

17. The method of claim 14, wherein the control interface is a serial peripheral interface (SPI) control interface that includes a clock pin, a data input pin, a data output pin, and the select pin.

18. The method of claim 14, wherein receiving the command to enter a first power mode comprises receiving the command from a microcontroller, and wherein the microcontroller comprises a processor and a memory storing instructions that, when executed by the processor, cause the microcontroller to release and assert the select signal to control a power mode of the electronic device.

19. The method of claim 14, wherein the second circuit comprises a flip-flop, and wherein causing a rise of a wakeup signal comprises toggling the flip-flop to cause the wakeup signal to rise in response to the assertion of the select signal.

20. The method of claim 14, wherein the second circuit comprises a flip-flop including a clock input tied to an output of a logic gate that receives as inputs the select signal on the select pin and a reset signal, and
wherein causing a rise of a wakeup signal comprises:
in response to the assertion of the select signal, toggling the flip-flop to cause the wakeup signal to rise; and
in response to a trigger of the reset signal, toggling the flip-flop to cause the wakeup signal to rise.

* * * * *